United States Patent [19]

Stewart

[11] 4,185,319
[45] Jan. 22, 1980

[54] NON-VOLATILE MEMORY DEVICE
[75] Inventor: Roger G. Stewart, Neshanic Station, N.J.
[73] Assignee: RCA Corp., New York, N.Y.
[21] Appl. No.: 948,507
[22] Filed: Oct. 4, 1978
[51] Int. Cl.$^2$ ............................................. G11C 11/40
[52] U.S. Cl. .................................. 365/185; 307/238; 357/53; 365/51
[58] Field of Search .................... 307/238, 279, 51; 365/182, 183, 184, 185, 52; 357/53, 68, 86, 89

[56] References Cited
U.S. PATENT DOCUMENTS

| | | | |
|---|---|---|---|
| 3,500,142 | 3/1970 | Kahng | 365/185 |
| 3,660,819 | 5/1972 | Frohman-Bentchkowsky | 365/185 |
| 3,728,695 | 4/1973 | Frohman-Bentchkowsky | 365/185 |
| 3,984,822 | 10/1976 | Simko | 365/174 |
| 4,063,274 | 12/1977 | Dingwall | 357/53 |

OTHER PUBLICATIONS

"A Floating Gate and Its Application to Memory Devices" D. Kahng et al. *Bell System Tech. Journal* Jul.-Aug. 1967 pp. 1288-1295.
A Distributed Gate Bistable MOS Transistor", Fu et al. *Solid State Electronics* 1971 vol. 14 pp. 799-804.
"Famos-A New Semiconductor Charge Storage Device" Frohman-Bentchkowsky, *Solid State Electronics* 1974 vol. 17 pp. 517-529.

*Primary Examiner*—Terrell W. Fears
*Attorney, Agent, or Firm*—H. Christoffersen; H. I. Schanzer; L. P. Benjamin

[57] ABSTRACT

A field-effect device with closed floating gate geometry suitable for use as a storage element in a non-volatile memory array.

12 Claims, 5 Drawing Figures

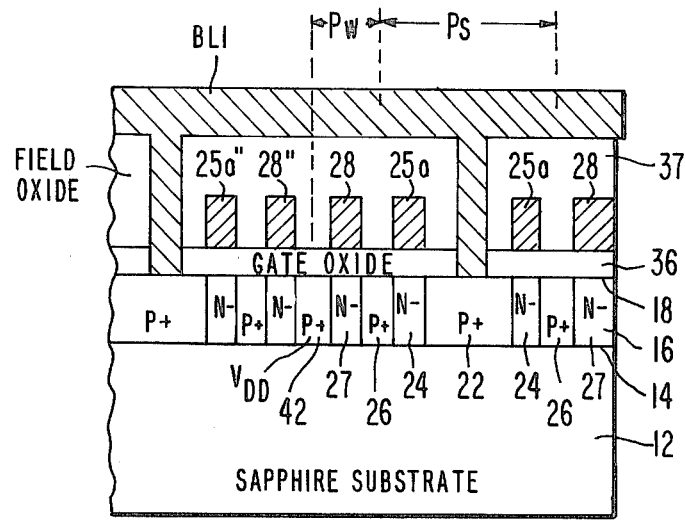
Fig. 3.
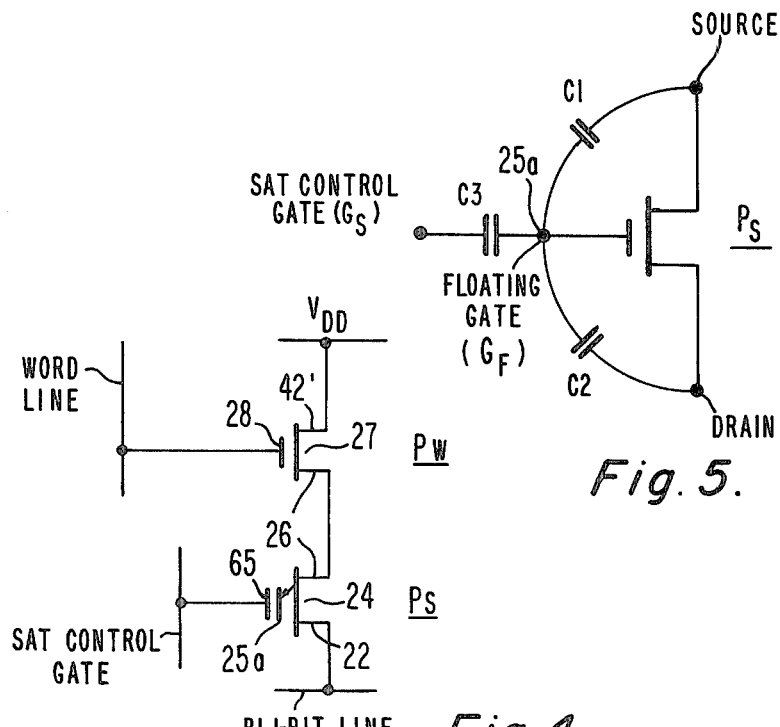
Fig. 5.
Fig. 4.

NON-VOLATILE MEMORY DEVICE

This invention relates to floating gate devices and to semiconductor memory arrays employing such devices.

Floating gate avalanche-injection memory devices are known and have been used for several years (see, for example, U.S. Pat. Nos. 3,660,819 and 3,728,695 to Dov Frohman-Bentchkowsky). Floating gate devices usually have source and drain regions of one conductivity formed in a substrate of the opposite conductivity, at the surface thereof. The space between the source and drain regions defines the channel region of the device over which a gate structure is formed by first applying a first thin insulating (oxide) layer. A conductive layer (the floating gate) is placed over the insulating layer and a second insulating layer is formed over and around the conductive layer to completely surround the floating gate and insulate it from the remainder of the device. A second conductive layer (the control gate) is then formed atop the second insulating layer.

These devices can be programmed (write operation) to store a charge on their floating gates by the application of a potential between the source and drain regions at a given current level. To program known P-channel floating gate devices requires, typically, signals having an amplitude of 35 volts at current levels of 5 milliamperes. In integrated circuit technology these signals are considered high power levels. Not only are these high power levels hard to generate and decode, but so much power is dissipated that continuous programming is impossible, forcing the user to develop complicated pulse and loop programmers. This disclosure describes a novel floating gate device which can be fully written at much lower voltage and current levels than known devices.

In floating gate devices in accordance with the invention the drain region of the device is surrounded by the channel region which in turn is surrounded by the source region; where each of the channel and source regions has a frame-like closed geometry (e.g. closes upon itself like a square or rectangular doughnut). The floating gate insulated from and overlying the channel follows the frame-like contour of the channel region and has a closed geometry. In addition, the source, channel and drain regions of the floating gate devices of the invention are preferably formed in a semiconductor body on an insulating substrate.

Also, in accordance with the invention, a non-volatile memory structure of the floating gate type device is described that may be readily formed into an x-y matrix in which an individual device, at the intersection of a given row and column, may be easily accessed for programming, reprogramming or reading.

FIG. 3 is a cross-sectional view taken along the line 3—3 of FIG. 1;

FIG. 4 is an equivalent schematic diagram of one cell of the array of FIG. 1;

FIG. 5 is an equivalent schematic diagram of a floating gate device.

Figure 1:
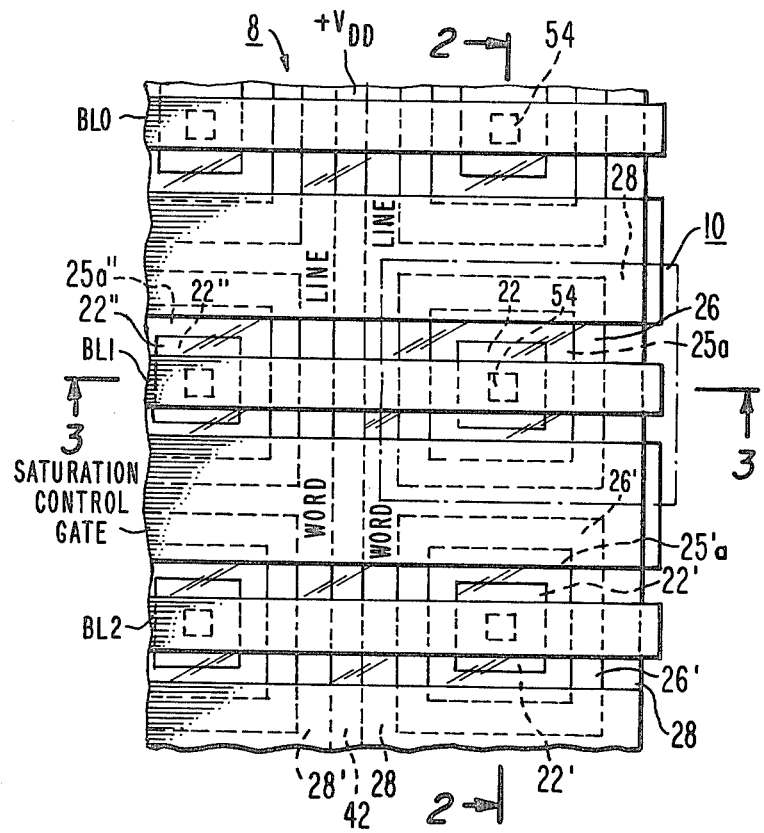
FIG. 1 is a plan view of a portion of an integrated circuit device embodying the invention.

FIG. 1 shows a portion of an integrated circuit 8 which includes an array of memory cells 10. Each cell, as shown in FIG. 4, includes a floating gate transistor, $P_S$, functioning as a storage or memory device and a word line switching transistor, $P_W$. $P_W$ is used to either isolate a selected $P_S$ from $V_{DD}$ or tightly couple $P_S$ to $V_{DD}$ and could be replaced by a suitable unidirectional conducting element (e.g. a diode) or other switching arrangement. Since the cells are similar, only the formation of one cell is described in detail. Further, while this invention is illustrated using silicon-on-sapphire (SOS) technology, it could also be practiced in bulk silicon or using other suitable technology.

Figure 2:
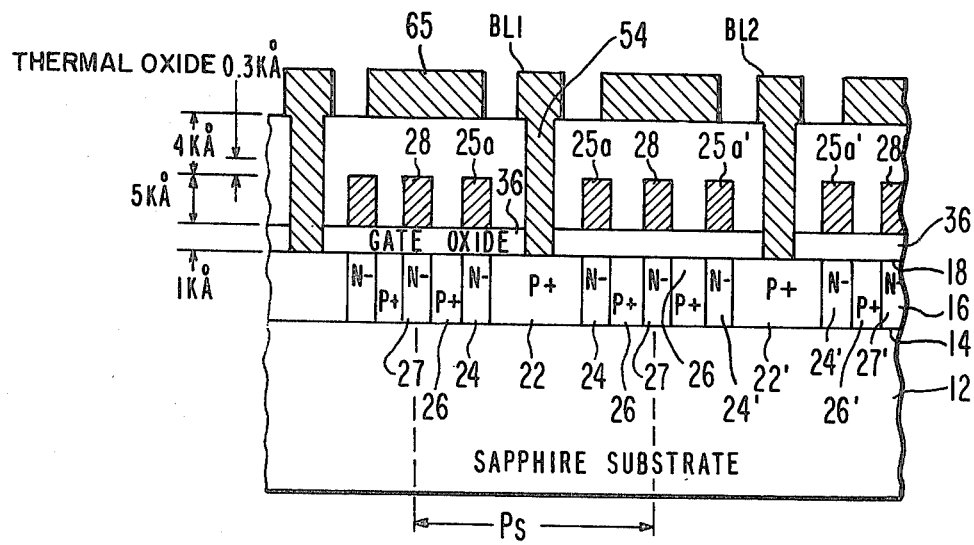
FIG. 2 is a cross-sectional view taken along the ling 2—2 of FIG. 1.

A cell 10 may be formed as shown in FIGS. 1, 2 and 3. Referring to FIG. 1 there is shown a drain region 22 (of a storage device $P_S$) surrounded at its surface perimeter by a gate structure 25a which in turn is surrounded by a source region 26. The frame-like gate structure 25a is insulated from and overlies a channel region 24 (formed between regions 22 and 26 see FIGS. 2 and 3) and has a closed geometry. That is, the gate structure has the configuration of a closed pattern which has a central opening therein. While rectangular structures are shown, any suitable topologically closed shape may be used. The rectangular shape is preferred for its adaptability to integrated circuit structures of relatively high packing density. Surrounding the source region 26, at its surface perimeter, is a polycrystalline silicon (poly or polysilicon) frame-like structure 28 which functions as a field shield. The structure 28 of adjacent cells of a column are common to each other forming a conductor, identified as the word line, which extends the length of a column. Structure 28 functions as a field shield between adjacent cells of a column and as the gate electrode of the $P_W$ transistors along a row. The source and drain regions of the $P_W$ transistors include, respectively, a region 42 to which is applied a potential ($+V_{DD}$ volts) and region 26.

Referring now to FIG. 2 it is seen that cell 10 is formed on a sapphire substrate 12 having a top surface 14. As is known in SOS technology, a layer 16 of epitaxially grown silicon is deposited on substrate 12. The epitaxial layer 16 is initially of one type conductivity (N type in this example) and has a surface 18. P+ regions diffused in the epitaxial layer 16 form the source and drain regions of the floating gate ($P_S$) and word line ($P_W$) transistors. Region 22 of P+ conductivity is the drain region of $P_S$. Region 24 of N-conductivity type which represents the channel region of $P_S$ wraps around, or surrounds, region 22. Region 24 is isolated from and underneath the floating gate electrode 25a. Region 26, of P+ conductivity type contiguous to region 24, functions as the source region of $P_S$ and the drain region of $P_W$. Region 26 wraps around channel region 24. Region 27 of N-conductivity type is contiguous to region 26 and serves as a guard band (or as an isolation means) between adjacent devices along a column (2—2 direction). In addition, region 27 functions as the channel region of the $P_W$ transistor along the row direction (3—3). Overlying and insulated from region 27 is the field shield conductive layer 28 (which in so far as $P_S$ and cell 10 is concerned) has the same frame like configuration as region 27. Between region 27 of one column and a like region 27' of an adjacent column there is a diffused region 42 which runs the length of the column. A potential of $+V_{DD}$ volts is applied to region 42 which functions as the source of the $P_W$ transistors formed along the two adjacent columns.

The source and drain regions are formed in layer 16 over which there is a thermally grown silicon dioxide layer 36 (hereinafter referred to as the gate oxide layer) having a thickness of approximately 1000 Å (FIGS. 2 and 3). A layer of polysilicon is deposited or grown on the oxide layer 36 and thereafter masked and etched to form both members 25a which represent the floating gate electrode of $P_S$ and the members 28 which represent the word line column conductors. The polysilicon regions 25a and 28 are highly doped to render them conductive. The thickness of the polysilicon layer is in the order of about 5000 Å. From FIG. 3, it is seen that word line 28 functions as the gate electrode of a P-channel device $P_W$ having source and drain regions 42 and 26, respectively, and a channel region 27. The concentric nature of the floating gate and switching transistors structures is also evident from FIGS. 2 and 3.

Ater the formation of floating gate 25a and gate 28, a second layer 37 of insulating field oxide is first thermally grown over gates 25a and 28 to a thickness of about 1000 Å. Gate 25a and 28 are, therefore, completely surrounded and covered by thermally grown oxide. Since this first, thermal oxide is of a relatively high quality, the rate at which charge escapes from floating gate 25a is relatively low. Thereafter, the thickness of the field oxide may be increased by approximately another 3000 Å using an oxide of a relatively lower quality than the thermal layer. The importance of having the field oxide made up of two different types of oxides is discussed below.

Thereafter, contact openings 54 are etched into field oxide layer 37 in order to make contact with drain regions 22 and a suitable metal contact is grown or deposited therein. To complete the device, metal bit lines ($BL_1$, $BL_2$) and, at least one, metal saturation control line are formed by, for example, depositing a metal layer (e.g. aluminum) masking and etching.

Each bit line $BL_1$, $BL_2$, extending the length of a row makes contact via contact holes 54 to the drains (22, 22'), of all the $P_S$ transistors in that row.

The saturation control gate is common to all the devices of the array 8, but individual control gate strips, each common to either one row or to two adjacent rows, could also be formed.

Circuit connections are made to the various word lines (28, 28') and to the bit lines ($BL_1$, $BL_2$, etc.) in order to switch the potentials on these lines to selectively write information into and to read the contents of the storage device of a selected word. The bit and word lines (conductors) are therefore decoded.

The metal gate saturation control gate formed on top of the field oxide overlaps the floating gate and can function as a bootstrap capacitor. Since the saturation control gate is insulated from the rest of the circuit by a thick oxide (typically 4000 Å), very high voltages can be applied to it without causing damage (i.e. rupture of the oxide or other components) to the floating gate devices. In the operation of the memory array the saturation control may be operated as a passive electrode to which large voltage excursions (e.g. 0 to 200 volts) are applied. Normally the potential $V_{GS}$ applied to the SAT control gate remains fixed for the full duration of an operation (e.g. write, erase, read). Its voltage could be decoded and switched like the bit and word lines. However, this would require much circuitry capable of operating at high voltages.

Devices embodying the invention can be programmed at relatively low voltages (e.g. 10 volts) and extremely low currents (e.g. 1 microampere). The power ($1 \times 10^{-6}$ amperes $\times$ 10 volts $= 10 \times 10^{-6}$ watts) needed to program a device embodying the invention is many orders of magnitude smaller than the power (e.g. $5000 \times 10^{-6}$ amperes $\times$ 35 volts $= 175,000 \times 10^{-6}$ watts) needed to program presently available floating gate devices. In addition to the substantial decrease in power consumption, the ability to write at a much smaller voltage (e.g., 10 volts versus 35 volts) enables the devices to be made smaller and denser without fear of breakdown. Also the substantially lower current drain enables the relaxation of the power supply design and reduces voltage drops and spikes along the current carrying lines and devices.

Further, devices embodying the invention can be programmed at voltages well below the normal source-to-drain breakdown voltage (e.g. 33 volts at 1 microampere) of the devices and can be erased with relatively low saturation control voltages.

The significant advantages obtained with the devices embodying the invention are believed to be due to one or more of the following features (taken singly or in combination): (a) frame like structure of the floating gate device; (b) the geometric asymmetry of the source and drain of the floating gate device; (c) the ability to apply large potentials to the saturation control gate; (d) the structure and properties of the epitaxially grown silicon film 16 on an insulating (e.g. sapphire) substrate; and (e) the different oxides used to form the field oxide layer.

To program a floating device $P_S$ an electrical charge must be placed on its floating gate 25a. This is achieved by turning on the $P_W$ transistor whose source drain path is in series with that of the $P_S$ transistor. With reference to FIG. 4, when a potential is applied to word line 28 which is negative with respect to $V_{DD}$ (where $V_{DD}$ is taken by way of example to be 15 volts) $P_W$ is turned on and $V_{DD}$ volts is applied via the conduction path of $P_W$ to region 26 which is the source of $P_S$. Therefore, to program device $P_S$, its associated $P_W$ is first turned on by applying an appropriate pulse to the word line and causing $V_{DD}$ volts to be applied to region 26 which functions as the source of $P_S$. The drain (region 22) of transistor $P_S$ connected to a bit line (e.g. $BL_1$) is held at a common potential (e.g. ground). A positive potential, for example, 50 volts is applied to the saturation control gate 65. To write the desired information into $P_S$, the 50 volts applied to its control gate 65, the 15 volts applied to its source, and ground to its drain, must be present for a time of, for example, 10 milliseconds duration. When these conditions are met a large depletion region or layer exists beneath the inversion layer formed near the surface of the conduction channel between the source and drain regions of $P_S$. Hot electrons from the depletion layer penetrate the gate oxide layer 36 and become trapped on the floating gate 25a. This hot carrier injection through the gate oxide layer 36 occurs when the electrons have sufficient energy to jump the energy bandgap associated with the interface of the silicon substrate and the silicon dioxide gate layer 36.

The frame-like structure of the floating gate 25a increases the electron collection efficiency of the device, since the whole electron emitting region is surrounded by the floating gate 25a. Also, the concentric nature of the gates 25a, 28 allows both the field-shield 28 and storage gate 25a to function as shield to block the flow of hot electrons from a device being programmed to adjacent memory cells in high density arrays.

The floating gate structure 25a has an inner peripheral boundary with region 22 and an outer peripheral boundary with region 26. The perimeter of the inner boundary and the associated floating gate-to-drain contact area, is obviously less than the perimeter of the outer boundary and the associated gate-to-source contact area.

Consequently, the floating gate-to-source capacitance ($C_1$) is greater than the floating gate-to-drain capacitance $C_2$. This feature provides a significant advantage since it enables a much larger portion of the voltage applied to the source electrode to be coupled to the floating gate.

As shown in FIG. 5, the floating gate device $P_S$ may be represented by a P-channel transistor $P_S$ having a capacitor $C_1$ connected between its source and its floating gate ($G_F$) and a capacitance $C_2$ connected between $G_F$ and the drain. In addition, a capacitance $C_3$ representing the field oxide-to-$G_F$ capacitance is shown connected between $G_F$ and the saturation control gate $G_S$. Assume, by way of example, that $C_1$ is equal to $2C_2$ and to $6C_3$, and that $P_S$ is being programmed for the first time. For the condition of 15 volts on the source, and with the drain and $G_S$ grounded, $G_F$ will be driven to 9 volts due to capacitive division between $C_1$, $C_2$ and $C_3$. The positive 9 volts on the gate attracts the hot electrons by injection through the gate oxide. Further, as noted above, the frame like shape of the floating gate increases the collection efficiency since it encloses the electron emitting region. Electrons are attracted to the gate until its potential decreases to a value of, for example, 0 volts. When that condition is reached, a repulsive field is set up which prevents further discharge of the floating gate, i.e. attraction of electrons.

If $C_1$ and $C_2$ were equal to each other and equal to (9/2) $C_3$ and the same write potential ($V_S=15$, $V_{GS}=0$ volts, $V_D=0$) were applied, as above, $G_F$ would only be driven to +6.75 volts. Clearly, the gate would be charged to a lower value of potential. The asymmetry between $C_1$ and $C_2$ ($C_1 > C_2$) is enhanced by the concentric ring or frame-like formation with the drain at the center and the source spaced apart therefrom. Thus, $C_1$ greater than $C_2$ is ensured.

The saturation control gate ($G_S$) further enhances the ability of $G_F$ to be set to a higher potential than would be possible in the absence of $G_S$. The net result of applying for example, 50 volts, to $G_S$ is to cause $V_{GF}$ (due to divider action between $C_1$, $C_2$ and $C_3$) to increase from 9 volts to 14 volts. This has two effects: (a) it increases $V_{GF}$ still further, causing $G_F$ to attract more electrons and to eventually be more negatively charged, when the potentials applied to the source and saturation control gates are returned to zero volts; and (b) applying a higher voltage (e.g. 14 volts) by $G_F$ reduces the gate-to-source (e.g. 15) potential of $P_S$ thereby reducing the conductivity of its conduction path and thereby greatly decreasing its power dissipation. In fact, by applying a high enough potential to the SAT control gate it is possible to fully program a floating gate device without significant conduction in the source-to-drain path of the devices (i.e. 1 microampere or less). This results in a considerable reduction in power dissipation. Therefore, the saturation control electrode may be used to both increase the effective threshold of the $P_S$ transistor and simultaneously reduce its conductivity during programming.

Once the floating gate device has reached steady state conditions, following the application of the write potentials to the device, $G_F$ may be assumed to be at zero volts. The subsequent return, at the termination of the write cycle, of the source potential to zero volts appears as a negative step of 15 volts amplitude causing $V_{GF}$ to be decreased by 9 volts (due to capacitive divider action between $C_1$, $C_2$ and $C_3$) to $-9$ volts.

Similarly, if and when the SAT control voltage is decreased from 50 volts to 0 volts, $V_{GF}$ is decreased by another 5 volts to $-14$ volts. Transistor $P_S$, then, has an effective threshold voltage of $-14$ volts and has been switched to a higher conduction state (corresponding to a gate-to-source potential of $-14$ volts) which provides for faster access to the memory since larger currents can flow, and better data retention due to longer period necessary to degrade the charge stored on the floating gate.

With respect to the epitaxially gorwn silicon film 16 the quality of the crystal structure, the electron mobility, the minority carrier lifetime and, therefore, the mean free path between collisions increase as one goes from the botton surface 14 to the top surface 18 of the epitaxial film. In SOS devices it is believed that avalanche at the depletion region which results in charging the floating gate, takes place near the surface of layer 16 in contrast to devices formed in bulk silicon in which avalanche may occur at other points between the diffused regions.

In an epitaxially grown film (e.g. 16) on sapphire there exists in the film many crystalline regions called grains which are similar but not exactly aligned. Where two different grains meet defines a grain boundary. It is believed that the grain sizes in the film are comparable in size to the depletion region near the drain. This allows for localized avalanche to occur along grain boundaries at voltages which are less than those required for gross avalanching across the entire depletion region.

The resulting localized breakdown and hot electron generation is so efficient in this structure that programming occurs with avalanche currents less than the normally measured leakage current of the device. This explains, in part, the observed lower voltage needed to program devices embodying the invention formed in SOS.

The electron charge stored on $G_F$ can be removed electrically by the application of a high (e.g. 20 to 200 volts) positive potential on the saturation control gate and, for example, applying ground potential to the source and drain of $P_S$.

It is believed that the formation of a thick (e.g. 3.7 KÅ) oxide of relatively higher conductivity (poor quality) overlying a thin (e.g. 300 Å) thermally grown oxide with relatively low conductivity (good quality) over the floating gate is an important factor in enhancing the ability to electrically erase the device. The electrical erasure of the floating gate device of the invention with its nonuniform dielectric in the field oxide is achieved at much lower potentials then is expected for similar size structures using a uniform oxide. The electric fields in the dielectric are redistributed due to the non-uniformities in the oxide so as to increase the field intensity in the oxide region closest to the floating gate. This effect, in combination with the increase in localized field intensity caused by the surface roughness of the polysilicon floating gate allows Fowler-Nordheim tunneling to occur at lower voltages than could be expected.

A selected device of a word (or all the devices along a row) is read by turning on its associated $P_W$ and sensing the current flowing through $P_S$ onto the bit line connected to the drain of $P_S$.

Reading of the device occurs in response to applying a relatively low voltage (5 volts) between the source and drain of the device. Referring to the example where $C_1 = 2C_2 = 6C_3$ an unprogrammed storage cell will have its gate coupled up to +3 volts and, therefore, a source to drain potential difference of 2 volts. If the P threshold is equal to or higher than 2 volts, the device will conduct no current (except leakage). However, a programmed device will have a source to drain potential difference of 16 volts insuring that high currents will flow from the drain into an appropriate sense amplifier which detects the difference in current between the two states.

What is claimed is:

1. In a floating gate storage device having first and second semiconductor regions spaced apart by a third region; said first and second regions forming the drain and source, respectively, of said device and said third region forming the channel region of said device; said floating gate device also having a first conductive floating gate member insulated from and overlying said channel region, and a second conductive control gate member insulated from and overlying at least a portion of said first gate, the improvement comprising:
   means for making the floating gate-to-source capacitance greater than the floating gate-to-drain capacitance wherein:
   (a) said channel region wraps around said drain region and closes upon itself;
   (b) said source region wraps around said channel region and closes upon itself; and
   (c) said first floating gate member overlies said channel region for the full length thereof and closes upon itself.

2. The floating gate storage device of claim 1 wherein the improvement further comprises the formation of said first, second and third regions within a body of semiconductor material located on an insulating substrate.

3. The floating gate storage device of claim 1 wherein the improvement further comprises a fourth region of semiconductive material surrounding said source region and closing upon itself and a third, field shield, conductive layer insulated from and overlying said fourth region and also closing upon itself; and
   wherein said first, second, third and fourth regions are formed within a body of semiconductor material located on an insulating substrate.

4. The floating gate storage device of claim 3 wherein said first and third regions are of one conductivity type and wherein said second and fourth regions are of opposite conductivity type.

5. The floating gate storage device of claim 4 further including:
   (a) a fifth region of said one conductivity type;
   (b) means for applying a potential to said fifth region; and
   (c) wherein said third conductive layer functions as the gate electrode of a field-effect transistor whose source and drain regions are said second and fifth region, said field-effect transistor when turned on coupling said potential to said second region.

6. The floating gate storage device of claim 1 wherein the perimeter of said drain region is less than the perimeter of said source region.

7. The combination as claimed in claim 1 wherein the improvement further comprises means for forming a first relatively thin high quality insulating layer completely surrounding said first floating gate member and a second relatively thick low quality insulating layer above said first high quality layer.

8. A solid state memory comprising:
   a body of semiconductor material predominantly of one conductivity type said body having a surface;
   a matrix array of memory cells, formed along one surface of said body arranged in rows and columns;
   each one of said cells comprised of a storage device ($P_S$) in series with a switching device ($P_W$), for selection, including:
   a field shield comprising a first frame-like structure including a layer of insulating material on said surface and a layer of conductive material on said layer of insulating material, said field shield having a closed geometry which encloses a first portion of said surface and separates said first portion of said surface from a second portion of said surface;
   a semiconductor device extending into said body in said first portion of said surface, said semiconductor device comprising:
   i. a second frame-like structure including a layer of insulating material on said first portion of said surface and a layer of conductive material on said layer of insulating material, said second frame-like structure having a closed geometry separating an outer portion of said first portion of said surface drom an inner portion of said first portion of said surface; said second frame-like structure defining the gate of said storage device;
   ii. a first region of opposite conductivity type to said body extending into said body from said inner portion of said first portion of said surface, said first region being surrounded by said second frame-like structure; said first region defining the drain region of said storage device;
   iii. a second region of opposite conductivity type to said body extending into said body from said outer portion of said first portion of said surface, said second region surrounding said second frame-like structure; said second region defining the source region of said storage device and the drain region of said switching device;
   a third region of opposite conductivity type to said body extending into said body surrounding said first frame like structure; said third region defining the drain region of said switching device and said first frame-like structure functioning as the gate of said switching device;
   said field shield of one device in a column being common to adjacent devices in that column and extending the length of a column,
   a field insulating layer overlying said frame-like structures, for insulating (floating) said second frame like structures;
   row conductors disposed above said field layer in a generally orthogonal direction to said columns, each row conductor overlying a row of memory cells and making contact to said first region via contact holes formed in insulating layers between a location on said first region at said surface of said body and said conductor; and
   a control gate disposed above said field layer and extending along said row conductors and overlying a portion of said second frame like structures.

9. The combination as claimed in claim 8 further including an insulating substrate, and wherein said body of semiconductor material is grown on said substrate.

10. A floating gate field effect device comprising:

(a) a body of semiconductor material predominantely of one conductivity type, said body having a surface;
(b) a floating gate comprising a first frame-like structure including a layer of insulating material on said surface and a layer of conductive material on said layer of insulating material, said floating gate having a closed geometry which encloses a first inner portion of said surface and separates said first portion of said surface from a second outer portion of said surface;
(c) a first region of opposite conductivity type to said body extending into said body from said first inner portion of said surface, said first region being surrounded by said first frame-like structure;
(d) a second region of opposite conductivity type to said body extending into said body from said second outer portion of said surface, said second region surrounding said first frame-like structure.
(e) a field shield comprising a second frame-like structure including a layer of insulating material on said surface and a layer of conductive material on said layer of insulating material surrounding at said surface said second region.
(f) a relatively thick insulating layer completely surrounding said floating gate and said field shield; and
(g) a layer of conductive material on top of said thick insulating layer overlying at least a portion of said floating gate.

11. The field-effect device as claimed in claim 10 further including an insulating substrate and wherein said semiconductor body is formed on said substrate.

12. The combination as claimed in claim 11 wherein a third region is formed within said body between said first and second regions isolated from and below said first frame like structure, surrounding said first region and defining the conduction channel of said floating gate field effect device.

* * * * *

UNITED STATES PATENT AND TRADEMARK OFFICE
CERTIFICATE OF CORRECTION

PATENT NO. : 4,185,319

DATED : January 22, 1980

INVENTOR(S) : Roger Green Stewart

It is certified that error appears in the above-identified patent and that said Letters Patent is hereby corrected as shown below:

```
Column 3, line 14, cancel "Ater" and insert --After--.
Column 4, line 27, after "floating" insert --gate--.
Column 5, line 50, cancel "by" and insert --to--.
Column 6, line 13, cancel "gorwn" and insert --grown--.
Column 6, line 17, cancel "botton" and insert --bottom--.
Column 6, line 54, cancel "then" and insert --than--.
Column 8, line 27, cancel "drom" and insert --from--.
Column 9, line 1, cancel "predominantely" and insert
--predominantly--.
Column 9, line 21, cancel "." and insert --;--.
Column 10, line 5, cancel "." and insert --;--.
```

Signed and Sealed this

First Day of July 1980

[SEAL]

*Attest:*

SIDNEY A. DIAMOND

*Attesting Officer*  *Commissioner of Patents and Trademarks*

Disclaimer 4,185,319.—*Roger G. Stewart*, Neshanic Station, N.J. NON-VOLATILE MEMORY DEVICE. Patent dated Jan. 22, 1980. Disclaimer filed Apr. 22, 1985, by the assignee, *RCA Corp.*

Hereby enters this disclaimer to claims 1 and 6 of said patent.
[*Official Gazette July 23, 1985.*]